United States Patent [19]

Kameda et al.

[11] Patent Number: 4,562,301

[45] Date of Patent: Dec. 31, 1985

[54] THROUGH-HOLE PIN FOR LAMINATED CIRCUIT SUBSTRATES AND METHOD OF INSERTION THEREOF

[75] Inventors: Eiichi Kameda; Seiichi Tobe, both of Ibaraki, Japan

[73] Assignee: Nippon Mektron Ltd., Japan

[21] Appl. No.: 577,773

[22] Filed: Feb. 7, 1984

[30] Foreign Application Priority Data

Feb. 8, 1983 [JP] Japan .................................. 58-19135

[51] Int. Cl.[4] .......................... H05K 1/14; H05K 3/00
[52] U.S. Cl. ..................................... 174/68.5; 29/829; 29/845; 361/414
[58] Field of Search .................. 29/829, 837, 840, 844, 29/845, 852; 361/397, 414; 174/68.5

[56] References Cited

U.S. PATENT DOCUMENTS 3,792,412  2/1974  Madden ................................ 361/414
4,230,385  10/1980  Ammon et al. ................ 174/68.5 X

OTHER PUBLICATIONS

Lennon et al., IBM Technical Disclosure Bulletin, vol. 21, No. 3, Aug. 1978, pp. 980–981.

*Primary Examiner*—A. T. Grimley
*Assistant Examiner*—Morris H. Nimmo
*Attorney, Agent, or Firm*—Fishman & Dionne

[57] ABSTRACT

A through-hole pin connection for laminated circuit elements and method of connection are presented. The laminated circuit element consists of a plurality of individual circuit elements, each element having a land area about the periphery of the through-hole. The through-hole pin has at least one ridged region located along the direction of insertion into the through-hole. Upon insertion, the pin guides a solder into the land areas and the ridged region effects electrical and mechanical contact between the through-hole pin and each of the land areas of the laminated circuit element.

12 Claims, 6 Drawing Figures

THROUGH-HOLE PIN FOR LAMINATED CIRCUIT SUBSTRATES AND METHOD OF INSERTION THEREOF

BACKGROUND OF THE INVENTION

This invention relates to a through-hole pin and connection for laminated circuit elements and a method of connection. More particularly, this invention relates to a new and improved through-hole pin and connection method of using the same, which effects an electrical and mechanical connection between circuit patterns in a laminated circuit element as well as guiding solder material into difficult to reach land areas within the through-hole.

Typically, laminated circuit elements consist of a plurality of individual printed circuit elements, i.e., printed circuit or wiring boards (each consisting of an insulating substrate with circuit traces or pattern thereon), which are laminated together. These multi-layer circuit elements are often used in electronic devices which require high-density wiring. Electrical connections among the various individual circuit elements in such laminated multi-layer circuit elements are usually effected by through-holes that are formed and aligned in each individual circuit element. The vertical through-holes may be formed in each circuit layer prior or subsequent to the layers being laminated. The area on each circuit element surrounding the periphery of each individual through-hole is defined as a land region. Solder is flowed into the through-hole whereby the land regions of each printed circuit element in the laminated circuit are connected to each other.

Unfortunately, many problems and deficencies have been encountered during the above through-hole/solder process. For example, when the solder is flowed into the through-hole, it is difficult to flow the solder smoothly because of its high surface tension. A well known method of facilitating the solder flowing is by using a conductive circular rod. This circular rod, which has a smaller diameter than to the through-hole, will act as a guide while the solder is being poured into the through-hole. However, because the inside circumference of the hole through the land region (i.e. the inside circumference of the opening in the conductive area) is generally withdrawn somewhat from the inside circumferential face of the through-hole in the insulating substrate, it is extremely difficult to bring the circular rod into contact with the recessed land region. As a consequence thereof, the flowing solder does not reach the recessed or withdrawn area of each land region resulting in poor solder flow and poor electrical connections.

Other conventional methods for connecting the land regions of laminated circuit elements, in addition to the aforementioned soldering process, include the well known plating and conductive paste methods. Unfortunately, the plating method is a burdensome and time consuming procedure involving a large number of processes. Similarly, the conductive paste method has problems associated therewith. For example, electrical connections is not reliable, and there is the possibility of peeling in the case of laminated multilayer elements comprised of individual flexible circuit elements.

SUMMARY OF THE INVENTION

The above discussed and other problems of the prior art are overcome or alleviated by the through-hole pin and connection and method of connection of the present invention. In accordance with the present invention, a novel conductive through-hole pin is inserted into the through-hole of a laminated circuit element consisting of a plurality of individual printed circuit elements. The novel through-hole pin of the present invention effects mechanical and electrical contact with the land portion of each circuit element. This connection is provided by at least one penetrating ridged region formed on the outside surface of the through-hole pin along the direction of its insertion. The ridged region of the through-hole pin cuts into the inside face of the through-hole thereby effecting electrical and mechanical contact with the hard to reach land region of the circuit elements. Solder is flowed into the through-hole after the pin is inserted, and the pin acts as a guide to flow the solder around the inner circumstance of each conductive land area and around the circumsference of the opening in each substrate layer to effect good electrical connection between all conductive layers through the solder.

The above discussed and other advantages of the present invention will be apparent to and understood by those skilled in the art from the following detailed description and drawings.

BRIEF DESCRIPTION OF THE DRAWINGS

Referring now to the drawings wherein like elements are numbered alike in the several FIGURES.

DESCRIPTION OF THE PREFERRED EMBODIMENT

Figure 1:
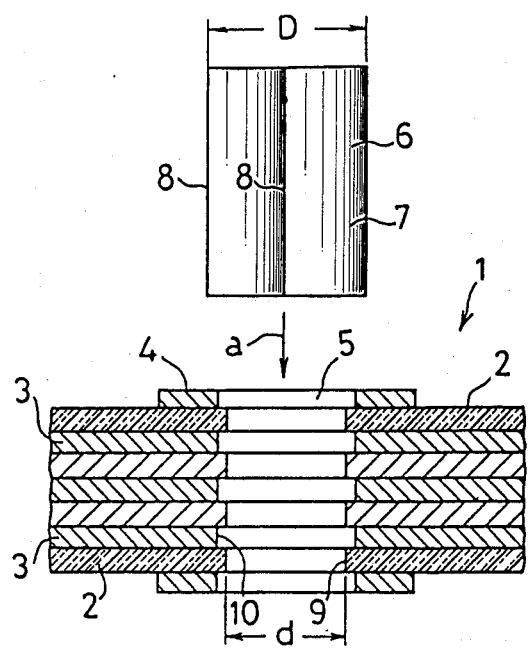
FIG. 1 is an elevation view, partially in cross-section, of a through-hole in a laminated circuit element, prior to insertion of a through-hole pin in accordance with the present invention.

Referring first to FIG. 1, a cross-sectional elevation view of a laminated circuit element is shown generally at 1. The laminated circuit element 1 is comprised of a plurality of individual printed circuit elements. Each individual element consists of an insulating substrate or base 2 having a printed pattern of conductive material 3 thereon. A through-hole 5 is formed through the entire laminated element 1 penetrating vertically therethrough. The peripheral area or region of each individual circuit element surrounding the through-hole 5 is defined as a land region 4. Note that the inner wall 10 of the through-hole opening in the land region 4 is recessed or withdrawn somewhat from the inside face 9 of the through-hole opening in the insulating substrate 2.

A through-hole pin 6, comprised of a suitable electrically conductive metal, is shown in FIG. 1 before the insertion thereof into the through-hole 5. The through-hole pin 6 is to be inserted in the direction indicated by the arrow a. In this particular embodiment of the present invention, the through-hole pin 6 has a body portion formed in the shape of a square column or peg and has four longitudinal corner peaked or ridged regions or areas 8 which are formed at the edges of the outside face 7. Note that the diagonal width of distance D of the through-hole pin 6 is somewhat greater than the inside diameter d of the through-hole 5 at surface 9 and also slightly greater than the diameter of the through-hole at surfaces 10.

Figure 3:
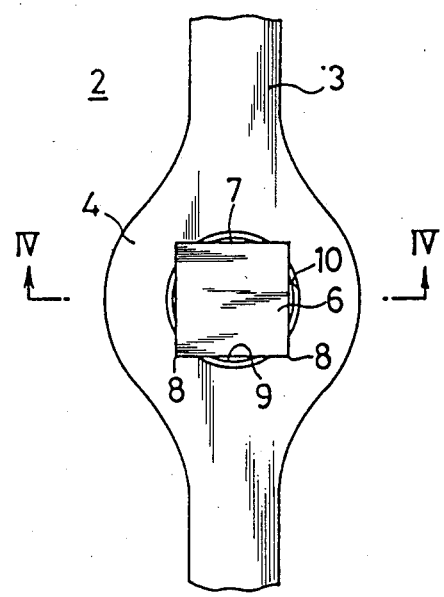
FIG. 3 is a plan view of FIG. 2.
Figure 2:
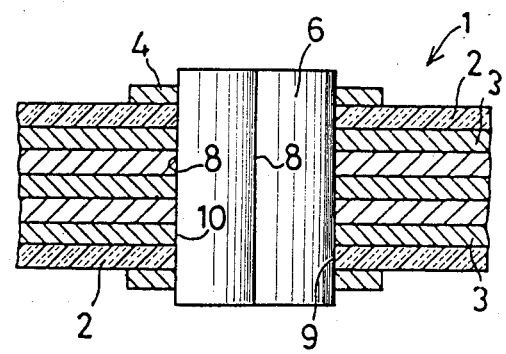
FIG. 2 is an elevation view, partially in cross-section and similar to FIG. 1, but with the pin inserted into the through-hole in accordance with the present invention.

When the through-hole pin 6, having the square column configuration, is inserted into the through-hole 5 in the direction indicated by the arrow a in FIG. 1, it will cut into the inside faces 9 and 10 of the through-hole 5 as shown in FIGS. 2 and 3. The through-hole pin 6 will thus make electrical and mechanical contact with the inside circumference 10 of each land region 4. This contact is effected by the ridged edges of the pin 6 cutting into the land regions 4 of the circuit element 1. Consequently, even though the outside face 10 of each individual land region 4 is withdrawn somewhat from the inside face 9 of the through-hole 5, the ridged regions 8 will be in secure electrical and mechancial contact with the inside face 10 of each land region 4.

Figure 4:
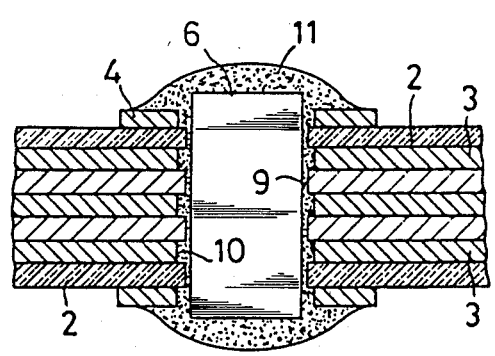
FIG. 4 is a cross sectional view along the line IV—IV of FIG. 3, after solder has been flowed into the through-hole in accordance with the present invention.

As shown in FIGS. 3 and 4, passages are formed between each land region 4 along the flat face surfaces 7 of pin 6. After the through-hole pin 6 has been inserted into the laminated circuit element 1, the entire assembly is subjected to a soldering treatment in a soldering tank. As shown in FIG. 4, the solder 11 will penetrate into the through-hole 5 and is guided by the through-hole pin 6 into contact with the surfaces 9 and 10. It will be appreciated that because each ridged region 8 of the through-hole pin 6 cuts into and is in electrical and mechanical contact with the inside face 10 of the land region 4, the solder 11 will be reliably guided to the entire inside face 10 of each land region 4 between the ridges 8 and will then adhere thereto. The solder also flows between ridges 8 in the wall areas 9 so that all land areas 4 (and hence all conductive tracers 3) are connected together. Thus, unlike the previously discussed prior art, the problem with poor passage of the solder material between each individual land region 4 due to vibration, shock, or any other reason will be prevented or alleviated by the present invention.

Figure 5:
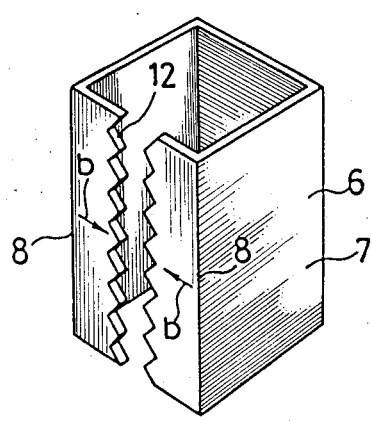
FIG. 5 is a perspective view of one embodiment of the through-pin in accordance with the present invention.
Figure 6:
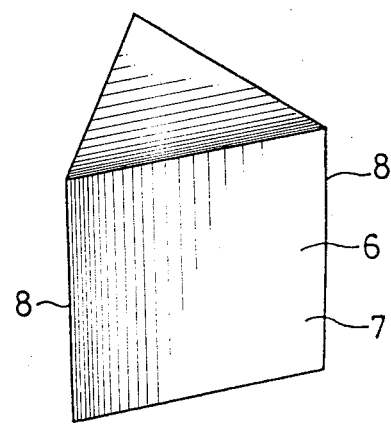
FIG. 6 is a perspective view of another embodiment of the through-pin in accordance with the present invention.

It should be understood that the through-hole pin of the present invention is not limited to the square column shown in FIGS. 1 through 4. Clearly many other modifications of the through-hole pin structure may be made without departing from the scope of the present invention. For example, in FIG. 5, the through-hole pin 6 therein is in the shape of a square column having undular or toothed cut slits 12 along one of the longitudinal faces and four ridged regions 8. When using the embodiment of FIG. 5, the through-hole pin 6 can be displaced in the direction shown by the arrows "b" resulting in easy insertion into the through-hole 5 because of the spring-action arising from the slit 12. Alternatively, the through-hole pin 6 may also be formed in the shape of a triangular column as shown in FIG. 6. In FIG. 6, through-hole pin 6 has three ridged regions 8 on the outside face 7 along the direction of insertion. It is clear from the above discussion that any suitably shaped through-hole pin may be encompassed by the present invention so long as the pin as at least one ridged or penetrating region.

In summary, the through-hole pin and connection of the present invention and the method of connection involves a multilayer circuit with a through-hole pin having at least one ridged region on the outside face of the through-hole pin along the direction of insertion thereof. The ridged region cuts into the inside face of the through-hole thereby securely effecting electrical and mechanical contact with the inside face of each individual land region in the laminated circuit element. The pin also acts as a guide for solder to penetrate the through-hole during a soldering treatment of the laminated circuit element.

In accordance with the present invention, the solder will be reliably guided to the inside face of each land region and thereafter become fixed to said face. Consequently, good solder passage and reliable electrical connection between the land regions of each individual circuit element in the laminated element are achieved, and the reliability of the overall connection will be markedly improved.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A multilayer laminated circuit assembly having a through-hole connection, the assembly including:

a plurality of conductive circuit elements on a plurality of insulating substrates, the conductive circuit elements and substrates being in a laminated array;

at least one through-hole in said laminated array through at least two conductive elements and one insulating substrate;

pin connecting means in said through hole for interconnection between said at least two conductive elements;

said pin connecting means having a body portion, said body portion being electrically conductive, said body portion having an outside surface;

at least one ridged region being on the outside surface of said body portion, said ridged region being located along the direction of said through-hole and penetrating into said at least two conductive elements whereby said ridged region effects electrical and mechanical contact between said body portion and each of said conductive elements; and solder material surrounding at least a portion of said pin connecting means and further electrically connecting said two conductive elements.

2. The assembly of claim 1 wherein:

said body portion has a square column shape, said square column having four longitudinal edges.

3. The assembly of claim 2 wherein:

said ridged region is positioned along at least one of said four longitudinal edges.

4. The assembly of claim 2 wherein:

said square column has at least one longitudinal undular cut slit therethrough.

5. The assembly of claim 1 wherein:

said body portion has a triangular column shape, said triangular column having three longitudinal edges.

6. The assembly of claim 5 wherein:

said ridged region is positioned along at least one of said three longitudinal edges.

7. A method of assembling a multilayer laminated circuit assembly having a through-hole connection using pin connecting means having a body portion, the body portion being electrically conductive, the body portion having an outside surface with at least one ridged region being on the outside surface of the body portion, the ridged region being located along the direction of the through-hole, the assembly method comprising the steps of:

providing a plurality of conductive circuit elements on a plurality of insulating substrates, the conductive circuit elements and substrates being in a laminated array;

providing at least one through-hole in said laminated array through at least two conductive elements and one insulating substrate;

inserting pin connecting means in said through hole for interconnection between said at least two conductive elements, whereby said pin connecting means penetrates into said at least two conductive elements and whereby said ridged region effects electrical and mechanical contact between said body portion and each of said conductive elements; and surrounding at least a portion of said pin connecting means with solder material and further electrically connecting said two conductive elements.

8. The assembly method of claim 7 including:
forming said body portion of said pin connecting means in a square column shape, said square column having four longitudinal edges.

9. The assembly method of claim 8 wherein:
positioning said ridged region along at least one of said four longitudinal edges.

10. The assembly method of claim 8 wherein:
providing said square column with at least one longitudinal undular cut slit therethrough.

11. The assembly method of claim 7 including;
forming said body portion of said pin connecting means in a triangular column shape, said triangular column having three longitudinal edges.

12. The assembly method of claim 11 wherein:
positioning said ridged region along at least one of said three longitudinal edges.

* * * * *